United States Patent
Sun et al.

(10) Patent No.: US 6,930,398 B1
(45) Date of Patent: Aug. 16, 2005

(54) PACKAGE STRUCTURE FOR OPTICAL IMAGE SENSING INTEGRATED CIRCUITS

(75) Inventors: Cheng-Kuang Sun, Hsin-Chu (TW); Kuang-Chih Cheng, Yun-Lin Hsien (TW); Kuang-Shin Lee, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/708,761

(22) Filed: Mar. 24, 2004

(51) Int. Cl.[7] ............................................. H01L 23/48
(52) U.S. Cl. ...................... 257/782; 257/783; 257/729; 257/E23.192; 257/E31.097; 257/794
(58) Field of Search ............................... 257/782, 783, 257/729, 794, E23.192, E31.097

(56) References Cited

U.S. PATENT DOCUMENTS

| | | | |
|---|---|---|---|
| 5,357,056 A | * | 10/1994 | Nagano ..................... 174/52.4 |
| 5,534,725 A | * | 7/1996 | Hur .............................. 257/434 |
| 5,773,323 A | * | 6/1998 | Hur .............................. 438/123 |
| 6,737,720 B2 | * | 5/2004 | Ho et al. ..................... 257/433 |
| 2003/0116817 A1 | * | 6/2003 | Yeh et al. ................... 257/444 |

FOREIGN PATENT DOCUMENTS

| | | | | |
|---|---|---|---|---|
| JP | 62-217640 | * | 9/1997 | ........... H01L 23/02 |
| JP | 62-264659 | * | 11/1997 | ........... H01L 23/28 |

* cited by examiner

*Primary Examiner*—Jasmine Clark
(74) *Attorney, Agent, or Firm*—Winston Hsu

(57) ABSTRACT

A package structure for optical image sensing devices is disclosed. The package structure includes an image sensing integrated circuit chip having a light receiving side and a backside. The image sensing integrated circuit chip has a light sensing area on the light receiving side. A plurality of light sensing devices are arranged in the light sensing area for converting incident light into electrical signals. A plurality of bonding pads are arranged along one or two sides of the light sensing area. Black sealing glue is asymmetrically coated on the outskirts of the light sensing area. The black sealing glue has at least two coating widths. A glass lid is glued over the light sensing area with the sealing glue.

14 Claims, 3 Drawing Sheets

PACKAGE STRUCTURE FOR OPTICAL IMAGE SENSING INTEGRATED CIRCUITS

BACKGROUND OF INVENTION

1. Field of the Invention

The present invention relates to packaging of image sensor components, and more particularly, to a package structure for optical image sensing integrated circuit devices with asymmetrically sealing glue coating.

2. Description of the Prior Art

Image sensor components such as charge coupled devices or CMOS image sensors have been widely applied to electronic products for converting light into electrical signals. The applications of image sensor components include monitors, cell phones, transcription machines, scanners, digital cameras, and so on. As size of image sensing components continues to shrink, the back end packaging processes for the image sensing components becomes more and more critical. It is known that the prior art image sensor packaging processes such as Plastic Leaded Chip Carrier (PLCC) or Ceramic Leaded Chip Carrier (CLCC) have poor performance and low yield.

FIG. 1 illustrates a prior art package structure of an image sensing component. As shown in FIG. 1, the image sensing component 1 is attached onto a plastic or ceramic carrier substrate 2. Typically, the image sensing component 1 is placed in a recessed area of the carrier substrate 2 and is sealed by a glass lid 3. The inner circuitry of the image sensing component 1 is connected to outer circuitry via bonding wires 4.

The above-described conventional package structure of an image sensing component has several drawbacks. For example, the packaging procedure is complicated, leading to long manufacture cycling time. Contaminations such as dusts or particles are easily introduced during packaging, thereby reducing product yields. Furthermore, the package size according to the prior art is too large.

SUMMARY OF INVENTION

Accordingly, it is one object of the present invention to provide an impact package structure for image sensing integrated circuit components having asymmetrically sealing glue coating.

It is another object of the present invention to provide a package structure for image sensing integrated circuit components with black sealing glue coating for improving image sensing sensitivity.

According to the claimed invention, a package structure for an image sensing integrated circuit component is provided. An image sensing integrated circuit chip having a light-receiving side and a backside is prepared. The light-receiving side includes a plurality of bonding pads and a light-sensing area for converting light into electrical signals. An asymmetrically coated glue frame is formed on outskirts of the light-sensing area on the light-receiving side of the image sensing integrated circuit chip. A cover glass seals the light-sensing area with the glue frame.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention is now explained with reference to a specific preferred embodiment and associated FIGS. 2–3. However, this preferred embodiment should be interpreted as illustrative and not limiting.

Figure 1:
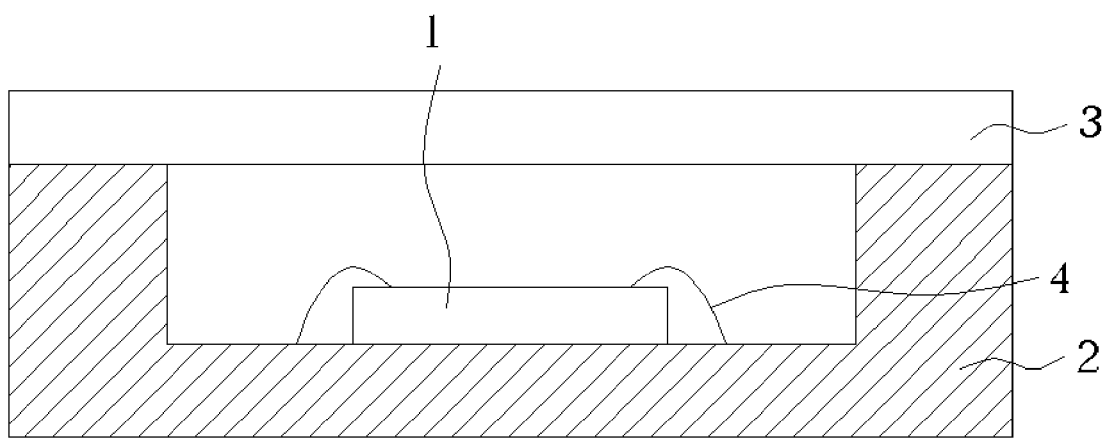
FIG. 1 is a schematic cross-sectional diagram illustrating a prior art package structure of an image sensing component.
Figure 2:
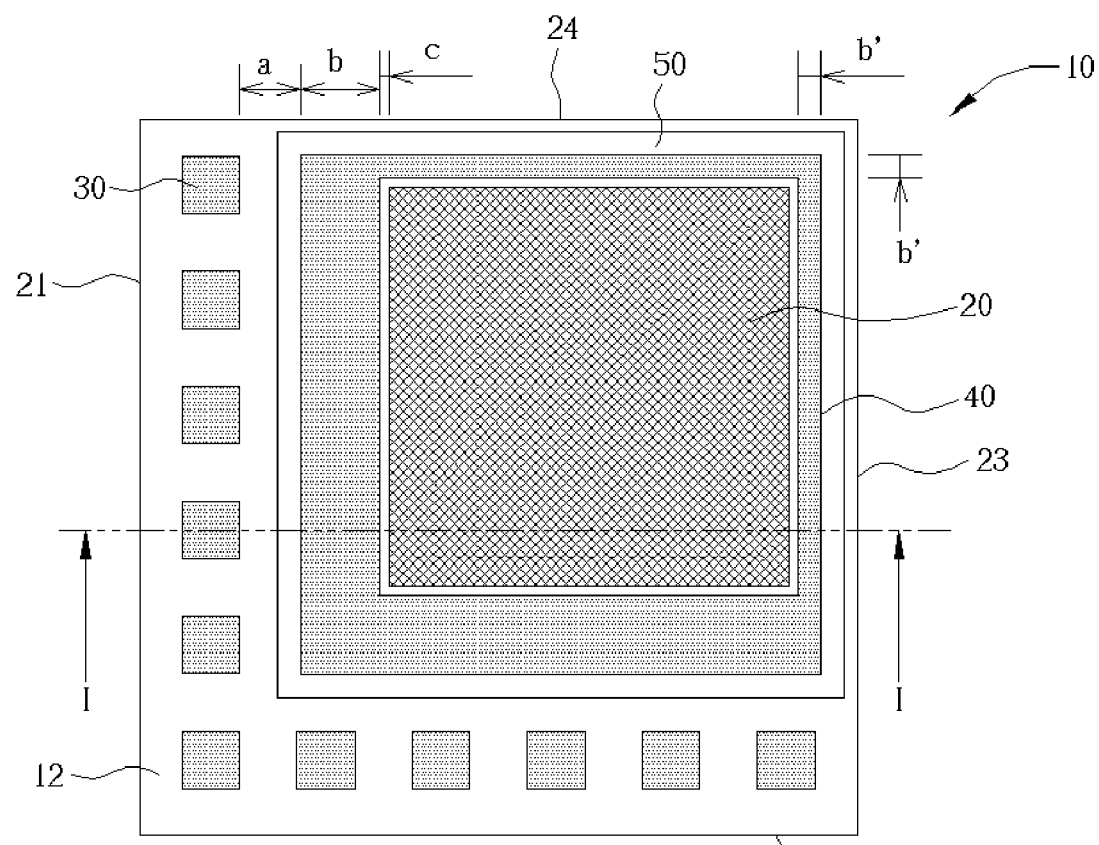
FIG. 2 is a top view illustrating a package structure of an image sensing integrated circuit component in accordance with this invention.
Figure 3:
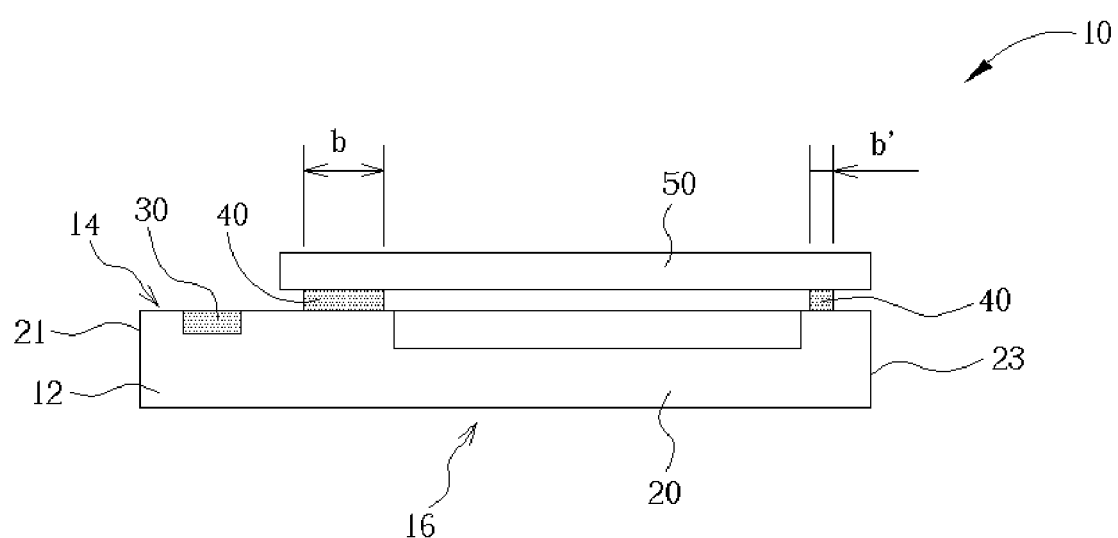
FIG. 3 is a schematic cross-sectional view showing the package structure along line I—I of FIG. 2.

Please refer to FIG. 2 and FIG. 3. FIG. 2 illustrates a package structure 10 of an image sensing integrated circuit component in accordance with this invention. FIG. 3 is a schematic cross-sectional view showing the package structure 10 along line I—I of FIG. 2. As shown in FIG. 2 and FIG. 3, the package structure 10 comprises an image sensing integrated circuit chip 12 having a light-receiving (front) side 14 and a backside 16. According to the preferred embodiment of this invention, the image sensing integrated circuit chip 12 is substantially rectangular shaped and has four sides 21, 22, 23, and 24, wherein the first side 21 and second side 22 are adjacent to each other, while the third side 23 and fourth side 24 are adjacent to each other, as specifically indicated in FIG. 2. The image sensing integrated circuit chip 12 further comprises a light sensing area 14 located on the light-receiving side 14 and a plurality of bonding pads arranged on the periphery along the first side 21 and the second side 22 of the image sensing integrated circuit chip 12. As specifically indicated, the rectangular light sensing area 14 is fabricated near the corner defined by the third side 23 and the fourth side 24. No bonding pads are arranged on periphery along the third side 23 and the fourth side 24. In another case, the bonding pads 30 may be arranged on the periphery along only one single side of the four sides 21, 22, 23, and 24 of the image sensing integrated circuit chip 12. An array of light sensor components (not shown) such as charge-coupled devices or CMOS image sensors are fabricated within the light-sensing area 20 for converting light into electrical signals.

The bonding pads 30 are used to connect inner circuitry of the image sensing integrated circuit chip 12 with outer circuitry such as printed circuit board. According to the prior art technology, the bonding pads are distributed along four sides of the image sensing chip. It is worthy noted that according to this preferred embodiment of the present invention, only the periphery along two adjacent sides (sides 21 and 22 in this case) are utilized to place these bonding pads 30. Instead of placing the light-sensing area at the center as that implemented in the prior art, the present invention places the light sensing area 20 near one corner of the chip. By doing this, the chip size as well as package size can be reduced.

In FIG. 2, an opaque, black glue frame 40 is coated on the outskirts of the light-sensing area 20 on the light-receiving side 14 of the image sensing integrated circuit chip 12. With the glue frame 40, a glass lid 50 is adhered on the light-receiving side 14 of the image sensing integrated circuit chip 12. The glue frame 40 and the glass lid 50 seal the light-sensing area 20 in a hermetical small chamber. In an ideal case, the glass lid 50 is in parallel with the light-sensing area 20. The black glue frame 40 may be epoxy resin such as UV epoxy or silicon blended with black dye. It is advantageous to use black glue on the outskirts of the light-sensing area 20 since it can promote light sensing sensitivity when operating.

The black glue frame 40 encircles the light-sensing area 20 and is substantially rectangular shaped corresponding to the rectangular light-sensing area 20. Overlapping between the black glue frame 40 and the light-sensing area 20 and overlapping between the black glue frame 40 and the bonding pads 30 are both prohibited. As specifically indicated in FIG. 2 and FIG. 3, the spacing between the edge of the black glue frame 40 and the bonding pads 30 is denoted with width "a"; the spacing between the edge of the black glue frame 40 and the light-sensing area 20 is denoted with width "c". The present invention also features that the black glue frame 40 has different widths: width "b" and width "b'", wherein b>b' (asymmetric coating pattern). The black glue frame 40 with larger width "b" is situated between the bonding pads 30 and the light-sensing area 20 for better support. Furthermore, it is advantageous to use the present invention because the packaging processes are completed at the back end of the fabrication of the wafer. Therefore, the packaging processes are simplified and contaminations such as dusts or particles can be prevented, leading to promoted product yields.

Those skilled in the art will readily observe that numerous modifications and alterations of the present invention may be made while retaining the teachings of the invention. Accordingly, the above disclosure should be construed as limited only by the metes and bounds of the appended claims.

What is claimed is:

1. A package structure for an image sensing integrated circuit component, comprising:
   an image sensing integrated circuit chip having a light-receiving side and a backside, wherein said light-receiving side includes a plurality of bonding pads and a light-sensing area for converting light into electrical signals;
   an asymmetrically coated glue frame formed on outskirts of said light-sensing area on said light-receiving side of said image sensing integrated circuit chip; and
   a cover glass sealing said light-sensing area with said glue frame.

2. The package structure for an image sensing integrated circuit component according to claim 1 wherein said light-sensing area includes a plurality of light sensing devices.

3. The package structure for an image sensing integrated circuit component according to claim 2 wherein said light sensing devices are CMOS image sensors.

4. The package structure for an image sensing integrated circuit component according to claim 2 wherein said light sensing devices are charge couple devices.

5. The package structure for an image sensing integrated circuit component according to claim 1 wherein said image sensing integrated circuit chip is substantially rectangular shaped and therefore has four sides, and wherein said plural bonding pads are arranged along only one single side of said four sides of said image sensing integrated circuit chip.

6. The package structure for an image sensing integrated circuit component according to claim 1 wherein said image sensing integrated circuit chip is substantially rectangular shaped and therefore has four sides, and wherein said plural bonding pads are arranged along only one two adjacent sides of said four sides of said image sensing integrated circuit chip.

7. The package structure for an image sensing integrated circuit component according to claim 1 wherein said asymmetrically coated glue frame comprises at least a first side with a first width and a second side with a second width that is smaller than the first width.

8. A package structure for an image sensing integrated circuit component, comprising:
   an image sensing integrated circuit chip having a light-receiving side and a backside, wherein said light-receiving side includes a plurality of bonding pads and a light-sensing area for converting light into electrical signals;
   an asymmetrically coated black glue frame formed on outskirts of said light-sensing area on said light-receiving side of said image sensing integrated circuit chip; and
   a cover glass sealing said light-sensing area with said glue frame.

9. The package structure for an image sensing integrated circuit component according to claim 8 wherein said light-sensing area includes a plurality of light sensing devices.

10. The package structure for an image sensing integrated circuit component according to claim 9 wherein said light sensing devices are CMOS image sensors.

11. The package structure for an image sensing integrated circuit component according to claim 9 wherein said light sensing devices are charge couple devices.

12. The package structure for an image sensing integrated circuit component according to claim 1 wherein said image sensing integrated circuit chip is substantially rectangular shaped and therefore has four sides, and wherein said plural bonding pads are arranged along only one single side of said four sides of said image sensing integrated circuit chip.

13. The package structure for an image sensing integrated circuit component according to claim 1 wherein said image sensing integrated circuit chip is substantially rectangular shaped and therefore has four sides, and wherein said plural bonding pads are arranged along only one two adjacent sides of said four sides of said image sensing integrated circuit chip.

14. The package structure for an image sensing integrated circuit component according to claim 1 wherein said asymmetrically coated black glue frame comprises at least a first side with a first width and a second side with a second width that is smaller than the first width.

* * * * *